United States Patent
Wu et al.

(10) Patent No.: US 11,952,264 B2
(45) Date of Patent: *Apr. 9, 2024

(54) ELECTRONIC DEVICE

(71) Applicant: Merry Electronics(Shenzhen) Co., Ltd., ShenZhen (CN)

(72) Inventors: Jia Yin Wu, Taichung (TW); Yung-Hsiang Chang, Taichung (TW); Yueh-Kang Lee, Taichung (TW)

(73) Assignee: Merry Electronics (Shenzhen) Co., Ltd., ShenZhen (CN)

( * ) Notice: Subject to any disclaimer, the term of this patent is extended or adjusted under 35 U.S.C. 154(b) by 259 days.

This patent is subject to a terminal disclaimer.

(21) Appl. No.: 17/557,050

(22) Filed: Dec. 21, 2021

(65) Prior Publication Data
US 2023/0124360 A1   Apr. 20, 2023

(30) Foreign Application Priority Data
Oct. 20, 2021   (TW) .................................. 110138951

(51) Int. Cl.
*H04R 19/04* (2006.01)
*B81B 3/00* (2006.01)
*B81C 1/00* (2006.01)

(52) U.S. Cl.
CPC ........ *B81B 3/0051* (2013.01); *B81C 1/00158* (2013.01); *H04R 19/04* (2013.01); *B81B 2201/0257* (2013.01)

(58) Field of Classification Search
CPC .................. H04R 19/005; H04R 19/04; B81B 2201/0257
See application file for complete search history.

(56) References Cited

U.S. PATENT DOCUMENTS

2018/0167740 A1* 6/2018 Uchida .................... H04R 9/08
2020/0107096 A1* 4/2020 Minervini ............ B81B 7/0006

FOREIGN PATENT DOCUMENTS

WO   WO-2021031498 A1 *   2/2021
WO   WO-2022000794 A1 *   1/2022

* cited by examiner

*Primary Examiner* — Herbert K Roberts
(74) *Attorney, Agent, or Firm* — JCIPRNET

(57) ABSTRACT

An electronic device including a substrate, a sensor, a partition wall structure, a pressurizing component, and a stopping structure is provided. The substrate has a carrying surface. The sensor is disposed on the carrying surface. The partition wall structure is disposed on the carrying surface and surrounds the sensor. The pressurizing component is disposed on the partition wall structure. The pressurizing component, the partition wall structure, and the substrate jointly form a cavity, and the pressurizing component includes a mass and a vibration membrane. The stopping structure is disposed between the pressurizing component and the partition wall structure and extends into the cavity. The stopping structure has at least one opening penetrating the stopping structure.

18 Claims, 9 Drawing Sheets

ELECTRONIC DEVICE

CROSS-REFERENCE TO RELATED APPLICATION

This application claims the priority benefit of Taiwan application serial no. 110138951, filed on Oct. 20, 2021. The entirety of the above-mentioned patent application is hereby incorporated by reference herein and made a part of this specification.

BACKGROUND

Technical Field

The disclosure relates to a device, and in particular to an electronic device.

Description of Related Art

At present, based on the design requirements of electronic devices, a sensor and a pressurizing component are often integrated. Therefore, when the pressurizing component vibrates, it may hit the sensor and cause damage to the sensor. Therefore, avoiding the situation of the pressurizing component hitting the sensor when the pressurizing component vibrates is a challenge.

SUMMARY

The disclosure provides an electronic device, in which the situation of a sensor being damaged and an electronic device failing to operate due to a pressurizing component, when being subject to strong external impact, excessively vibrating and hitting the sensor is avoided.

An electronic device of the disclosure includes a substrate, a sensor, a partition wall structure, a pressurizing component, and a stopping structure. The substrate has a carrying surface. The sensor is disposed on the carrying surface. The partition wall structure is disposed on the carrying surface and surrounds the sensor. The pressurizing component is disposed on the partition wall structure. The pressurizing component, the partition wall structure, and the substrate jointly form a cavity, and the pressurizing component includes a mass and a vibration membrane. The stopping structure is disposed between the pressurizing component and the partition wall structure and extends into the cavity. The stopping structure has at least one opening penetrating the stopping structure.

In an embodiment of the disclosure, the above-mentioned stopping structure is disposed between the pressing component and the sensor, and forms at least one spacing with the pressing component and the sensor, respectively.

In an embodiment of the disclosure, a shortest distance between the above-mentioned stopping structure and the pressing component is less than a shortest distance between the stopping structure and the sensor.

In an embodiment of the disclosure, a shape of the above-mentioned mass and a shape of the at least one opening are both rectangular.

In an embodiment of the disclosure, a length of the above-mentioned at least one opening is greater than a length of the mass.

In an embodiment of the disclosure, a material of the above-mentioned partition wall structure is different from a material of the stopping structure, and the stopping structure is sandwiched between the partition wall structure and the pressing component.

In an embodiment of the disclosure, a material of the above-mentioned partition wall structure is the same as a material of the stopping structure, and the partition wall structure and the stopping structure are an integral structure.

In an embodiment of the disclosure, the above-mentioned at least one opening is aligned to the mass.

In an embodiment of the disclosure, the above-mentioned mass, the at least one opening, and the sensor at least partially overlap.

In an embodiment of the disclosure, a width of the above-mentioned at least one opening is smaller than a width of the mass.

In an embodiment of the disclosure, the stopping structure comprises an anti-stiction protrusion extending toward the vibration membrane and a support portion connected to the anti-stiction protrusion.

In an embodiment of the disclosure, the above-mentioned anti-stiction protrusion is aligned to the vibration membrane.

In an embodiment of the disclosure, the above-mentioned anti-stiction protrusion surrounds a periphery of the support portion and is disposed along a periphery of the at least one opening.

In an embodiment of the disclosure, the above-mentioned at least one opening is multiple openings.

In an embodiment of the disclosure, the above-mentioned electronic device further includes a tuning layer, disposed on a surface of the stopping structure close to the sensor.

In an embodiment of the disclosure, the above-mentioned tuning layer is disposed corresponding to the at least one opening.

Based on the above, in the electronic device of the disclosure, through adopting the stopping structure, the stopping structure is disposed between the pressurizing component and the partition wall structure and extends into the cavity having the sensor. In this way, the stopping structure limits the over-displacement of the pressurizing component. In addition, since the stopping structure has at least one opening penetrating the stopping structure, the existence of the stopping structure does not affect the transmission of air from the electronic device to the sensor. Therefore, in the electronic device of the disclosure, the performance of the product is adjusted through the structure of the invention, and the situation of the sensor being damaged and the electronic device failing to operate due to the pressurizing component, when being subject to strong external impact, excessively vibrating and hitting the sensor, is avoided.

To provide a further understanding of the above features and advantages of the disclosure, embodiments accompanied with drawings are described below in details.

DESCRIPTION OF THE EMBODIMENTS

Figure 1A:
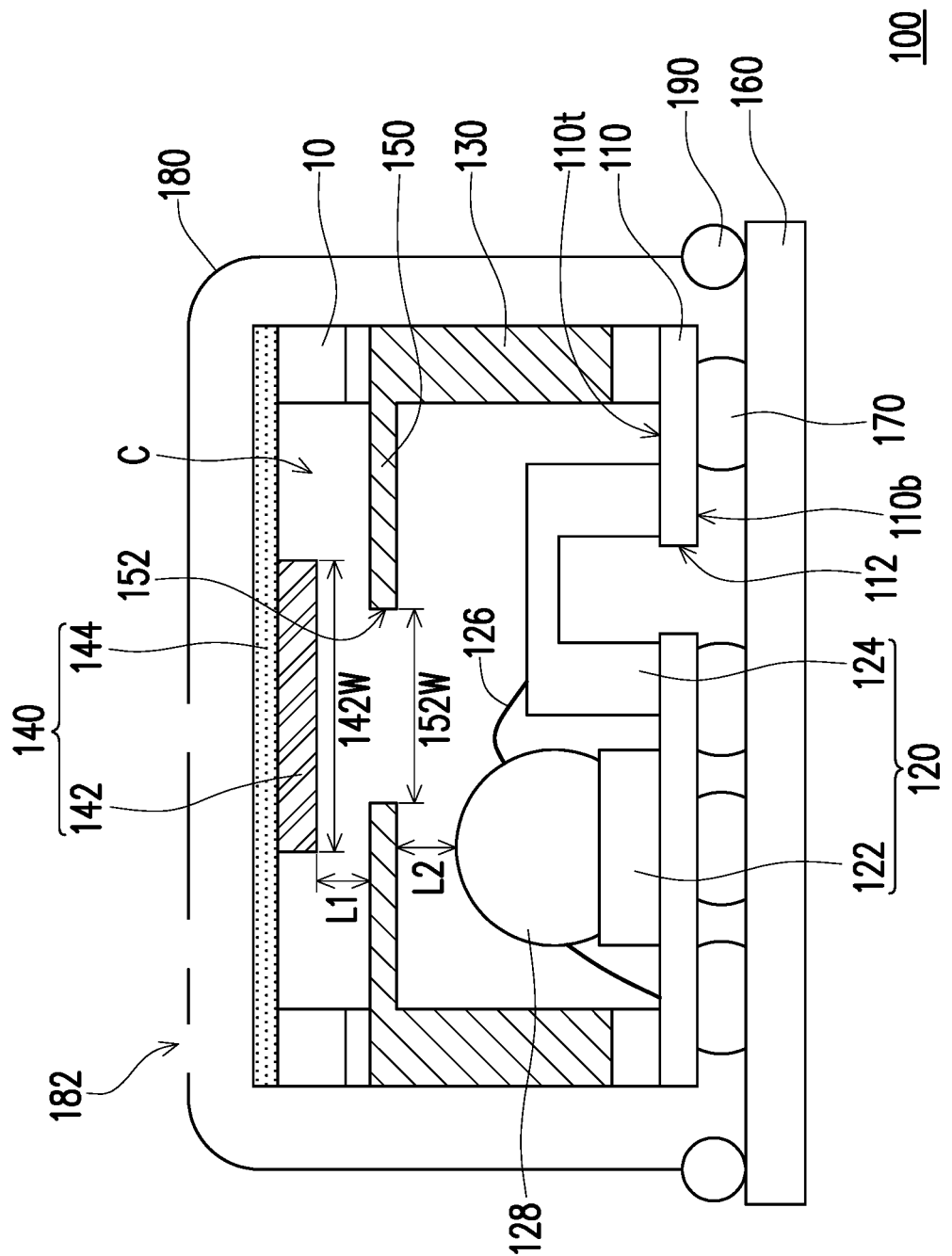
FIG. 1A is a schematic cross-sectional view of an electronic device according to an embodiment of the disclosure.

The directional terms (for example, up, down, right, left, front, back, top, bottom) used herein are only used to refer to the drawings, and are not intended to imply absolute orientation.

The drawings of the embodiment may be referred to for a better understanding of the disclosure. However, the disclosure may also be embodied in various forms and should not be limited to the embodiment described in this document. The thickness or size of layers or regions in the drawings is exaggerated for clarity. Same or similar reference numerals indicate same or similar elements, which will not be repeated in the following paragraphs.

Figure 1B:
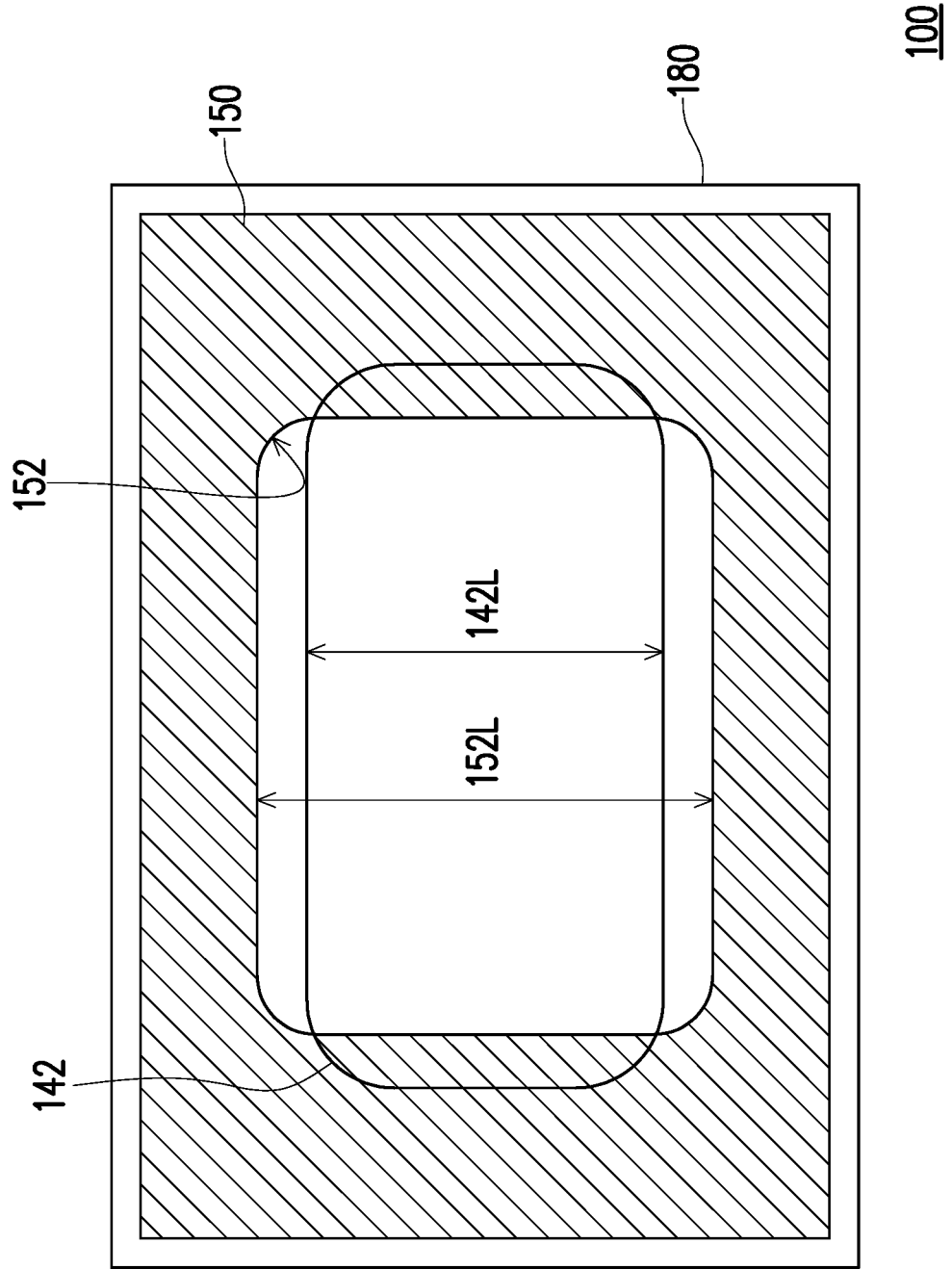
FIG. 1B is a schematic top view of FIG. 1A.

FIG. 1A is a schematic cross-sectional view of an electronic device according to an embodiment of the disclosure. FIG. 1B is a schematic top view of FIG. 1A.

Referring to FIGS. 1A and 1B, an electronic device 100 of this embodiment at least includes a substrate 110, a sensor 120, a partition wall structure 130, a pressurizing component 140, and a stopping structure 150. Furthermore, the substrate 110 has a carrying surface 110*t*, the sensor 120 and the partition wall structure 130 are disposed on the carrying surface 110*t*, and the partition wall structure 130 surrounds the sensor 120. In addition, the pressurizing component 140 is disposed on the partition wall structure 130, and the pressurizing component 140, the partition wall structure 130, and the substrate 110 jointly form a cavity C, so the sensor 120 may be located in the cavity C. Here, the pressurizing component 140 includes a mass 142 and a vibration membrane 144.

In this embodiment, in the electronic device 100, through adopting the stopping structure 150, the stopping structure 150 is disposed between the pressurizing component 140 and the partition wall structure 130 and extends into the cavity C having the sensor 120. In this way, the stopping structure 150 limits the over-displacement of the pressurizing component 140. Since the stopping structure 150 has at least one opening 152 penetrating the stopping structure 150, the existence of the stopping structure 150 does not affect the conduction of air pressure from the electronic device 100 to the sensor 120. Therefore, in the electronic device 100 of this embodiment, the vibration performance of the sensor 120 may be adjusted, and the situation of the sensor 120 being damaged and the electronic device failing to operate due to the pressurizing component 140, when being subject to strong external impact, excessively vibrating and hitting the sensor 120, may be avoided. Furthermore, when the pressurizing component 140 vibrates due to the impact of an instant external force (for example, a drop), the pressurizing component 140 has a greater displacement amplitude, so the probability of the pressurizing component 140 hitting the sensor 120 is also greater. Therefore, when the electronic device 100 of this embodiment is subject to strong external impact, the situation of the entire electronic device 100 failing to operate due to the sensor 120 being hit and damaged may be avoided, but the disclosure is not limited thereto.

In some embodiments, when the pressurizing component 140 vibrates, it moves in the direction perpendicular to the substrate 110, for example. Therefore, the stopping structure 150 may be disposed between the pressurizing component 140 and the sensor 120 (that is, on a displacement path perpendicular to the substrate 110) to prevent the pressurizing component 140 from hitting the sensor 120 below it when the pressurizing component 140 vibrates. Specifically, the stopping structure 150, the pressurizing component 140, and the sensor 120 may respectively form at least one spacing (for example, a spacing L1 and a spacing L2 in FIG. 1A). With these spacings, the stopping structure 150 may play a buffering function between the pressurizing component 140 and the sensor 120 and therefore has a stopping function. Here, the spacing L1 and the spacing L2 may be between 50 micrometers and 100 micrometers, but the disclosure is not limited thereto. The spacing L1 and the spacing L2 may be adjusted according to actual design requirements.

In some embodiments, the spacing L1 is a shortest distance between the stopping structure 150 and the pressurizing component 140, and the spacing L2 is a shortest distance between the stopping structure 150 and the sensor 120. The shortest distance between the stopping structure 150 and the pressurizing component 140 is less than the shortest distance between the stopping structure 150 and the sensor 120, so as to avoid impact caused by asymmetric displacement (oblique insertion) of the pressurizing component 140, thereby further ensuring that the stopping structure 150 effectively perform the stopping function, but the disclosure is not limited thereto.

In this embodiment, as shown in FIG. 1B, the shapes of the mass 142 and the opening 152 are both rectangular, but the disclosure is not limited thereto. The shapes of the mass 142 and the opening 152 may be determined according to actual design requirements. For example, in an unillustrated embodiment, the shapes of the mass 142 and the opening 152 may be circular. In addition, the mass 142 and the opening 152 may be rectangles with different lengths and widths. The stopping structure 150 performs stopping by a shorter side, while a longer side joins a pressurizing component with a larger area to ensure the feasibility of a process. For example, a length 152L of the opening 152 may be greater than a length 142L of the mass 142, but the disclosure is not limited thereto.

In this embodiment, the opening 152 is aligned to the mass 142, and the mass 142, the opening 152, and the sensor 120 at least partially overlap. For example, the orthographic projection of the mass 142 on the substrate 110, the orthographic projection of the opening 152 on the substrate 110, and the orthographic projection of the sensor 120 on the substrate 110 may at least partially overlap. Furthermore, in this embodiment, a width 152W of the opening 152 may be smaller than a width 142W of the mass 142, but the disclosure is not limited thereto. The size of the opening 152 of the stopping structure 150 may be designed to correspond to the air damping in the cavity C to meet the requirements of the electronic device 100.

In some embodiments, the material of the partition wall structure 130 and the material of the stopping structure 150 are homogeneous materials. In other words, the material of the partition wall structure 130 is the same as the material of the stopping structure 150. Therefore, the partition wall structure 130 and the stopping structure 150 may be an integral structure (for example, together formed by stamping), but the disclosure is not limited thereto. In other embodiments, the material of the partition wall structure 130 and the material of the stopping structure 150 are heterogeneous materials. In other words, the material of the partition wall structure 130 is different from the material of the stopping structure 150. Therefore, the stopping structure 150 may be sandwiched between the partition wall structure 130 and the pressurizing component 140 by assembly, but the disclosure is not limited thereto.

In some embodiments, the sensor 120 may include a processing chip 122 and a sensing chip 124. Specifically, the sensing chip 124 may be a microphone element to sense the pressure change caused by the vibration of the pressurizing component 140, and the processing chip 122 may be application specific integrated circuits (ASIC) to receive and process a signal measured by the microphone element, but the disclosure is not limited thereto.

In some embodiments, the sensing chip 124 covers a through hole 112 of the substrate 110, and the processing chip 122 is disposed to be adjacent to the sensing chip 124, but the disclosure is not limited thereto. The processing chip 122 and the sensing chip 124 may be disposed according to actual design requirements.

In some embodiments, the electronic device 100 further includes another substrate 160 disposed on another side of the substrate 110 opposite to the sensor 120, the partition wall structure 130, and the pressurizing component 140, but the disclosure is not limited thereto.

In some embodiments, the substrate 110 and said another substrate 160 are circuit substrates. For example, the substrate 110 and said other substrate 160 are printed circuit boards (PCB). A material of the partition wall structure 130 includes steel, copper, printed circuit board, or high temperature resistance (may be achieved through a reflow welding process) material. A material of the mass 142 is metal (such as steel or copper), and a material of the vibration membrane 144 is plastic (such as polytetrafluoroethene (PTFE), polytetrafluoroethene (PE), polyimide (PI), or polyether ether ketone (PEEK)), but the disclosure is not limited thereto. Each of the above components may be replaced by any other suitable material.

In some embodiments, the electronic device 100 further includes a plurality of electrically conductive parts 170 disposed between the substrate 110 and said another substrate 160. In other words, the plurality of electrically conductive parts 170 are disposed on a surface 110b of the substrate 110 opposite to the carrying surface 110t, but the disclosure is not limited thereto. Here, the electrically conductive part 170 may be a metal solder ball or a suitable conductive terminal adapted for an electrical connection between the substrate 110 and said another substrate 160.

In some embodiments, the electronic device 100 further includes a bonding wire 126 and an insulating layer 128 disposed on the sensor 120. The bonding wire 126 may connect the processing chip 122 and the sensing chip 124 to form an electrical connection between the processing chip 122 and the sensing chip 124, but the disclosure is not limited thereto.

In some embodiments, a material of the bonding wire 126 is, for example, gold or other suitable conductive materials, and a material of the insulating layer 128 is, for example, vinyl or other suitable insulating materials, and the disclosure is not limited thereto.

In some embodiments, the electronic device 100 includes a casing 180 and other electrically conductive parts 190 disposed on said another substrate 160. Said other electrically conductive parts 190 are disposed between the casing 180 and said another substrate 160. Said other electrically conductive parts 190 may be metal solder balls or suitable conductive terminals, so the casing 180 may be electrically connected to said another substrate 160 through said other electrically conductive parts 190, but the disclosure is not limited thereto.

In some embodiments, the casing 180 further includes an exhaust port 182, and there may be one or more exhaust ports 182 to release excess pressure in the electronic device 100, but the disclosure is not limited thereto.

In some embodiments, the electronic device 100 further includes a retaining ring 10 disposed between the vibration membrane 144 and the stopping structure 150. The retaining ring 10 is a rigid material, so it may reliably connect the pressurizing component 130 and the stopping structure 150 so as to improve the reliability of the electronic device 100, but the disclosure is not limited thereto.

It must be noted here that the following embodiment uses the reference numerals and part of the content of the above embodiment. Same or similar reference numerals are used to refer to same or similar elements, and the description of the same technical content is omitted. The aforementioned embodiment may be referred to for the description of the omitted parts, which will not be repeated in the following embodiment.

Figure 2:
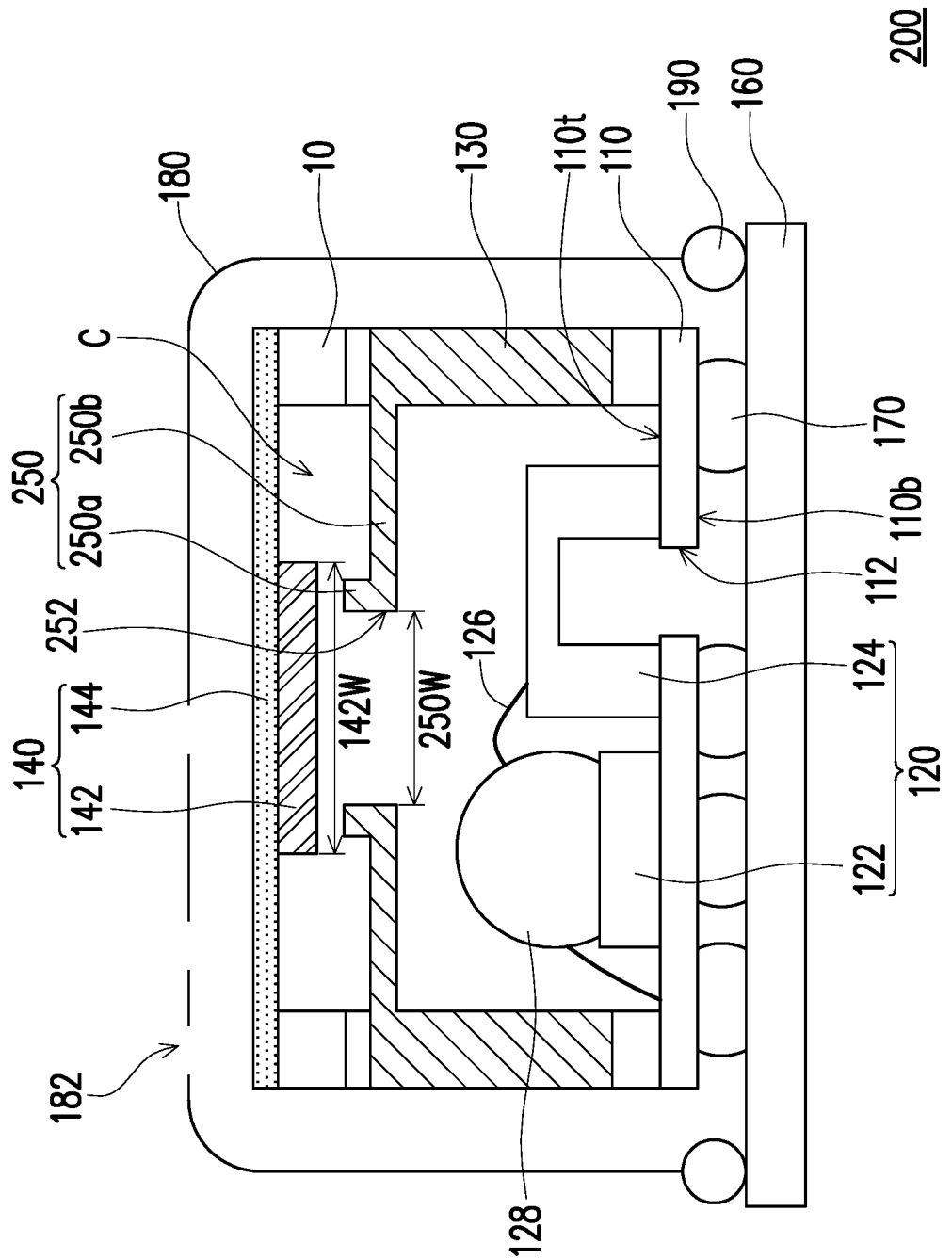
FIG. 2 is a schematic cross-sectional view of an electronic device according to another embodiment of the disclosure.

FIG. 2 is a schematic cross-sectional view of an electronic device according to another embodiment of the disclosure. Referring to FIG. 2, compared to the electronic device 100, a stopping structure 250 of an electronic device 200 of this embodiment includes an anti-stiction protrusion 250a extending toward the vibration membrane 144 and a support portion 250b connected to the anti-stiction protrusion 250a. Since the anti-stiction protrusion 250a may be a funnel-shaped structure and has a small contact area with the pressurizing component 140, an anti-stiction effect may be achieved. In addition, an opening width 250W of the stopping structure 250 may be smaller than the width 142W of the mass 142, so the anti-stiction protrusion 250a may be aligned to the mass 142, but the disclosure is not limited thereto.

Furthermore, the anti-stiction protrusion 250a surrounds the periphery of the support portion 250b and is disposed along the periphery of an opening 252 of the stopping structure 250. In other words, the anti-stiction protrusion 250a may define the boundary of the opening 252, but the disclosure is not limited thereto.

Figure 3:
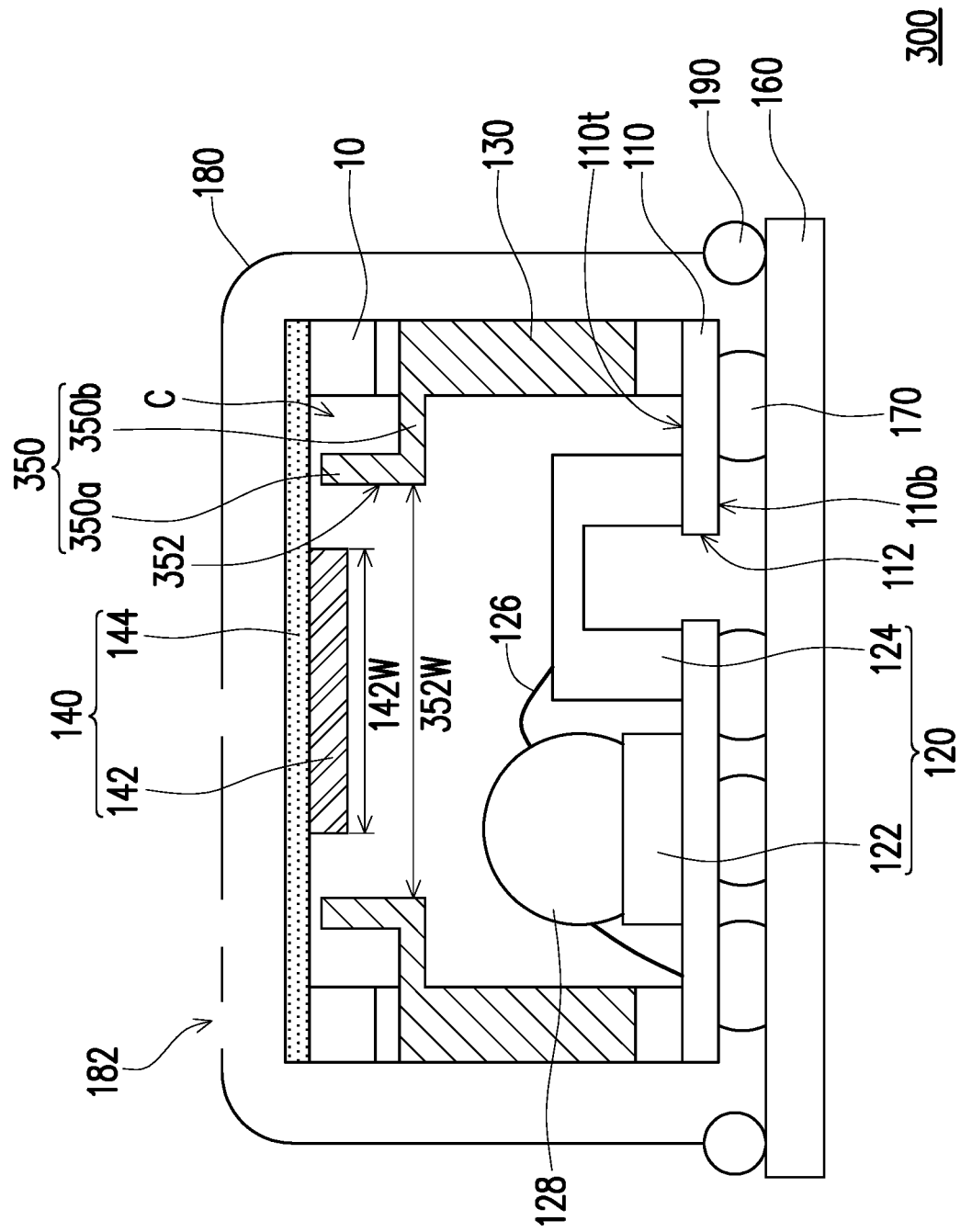
FIG. 3 is a schematic cross-sectional view of an electronic device according to another embodiment of the disclosure.

FIG. 3 is a schematic cross-sectional view of an electronic device according to another embodiment of the disclosure. Referring to FIG. 3, compared to the electronic device 200, a stopping structure 350 of an electronic device 300 of this embodiment includes an anti-stiction protrusion 350a extending toward the vibration membrane 144 and a support portion 350b connected to the anti-stiction protrusion 350a. A width 352W of an opening 352 of the stopping structure 350 is greater than the width 142w of the mass 142. Therefore, the anti-stiction protrusion 350a is aligned to the vibration membrane 144 to further reduce the overall height of the electronic device 300, thereby reducing the size of the electronic device 300, but the disclosure is not limited thereto.

Figure 4:
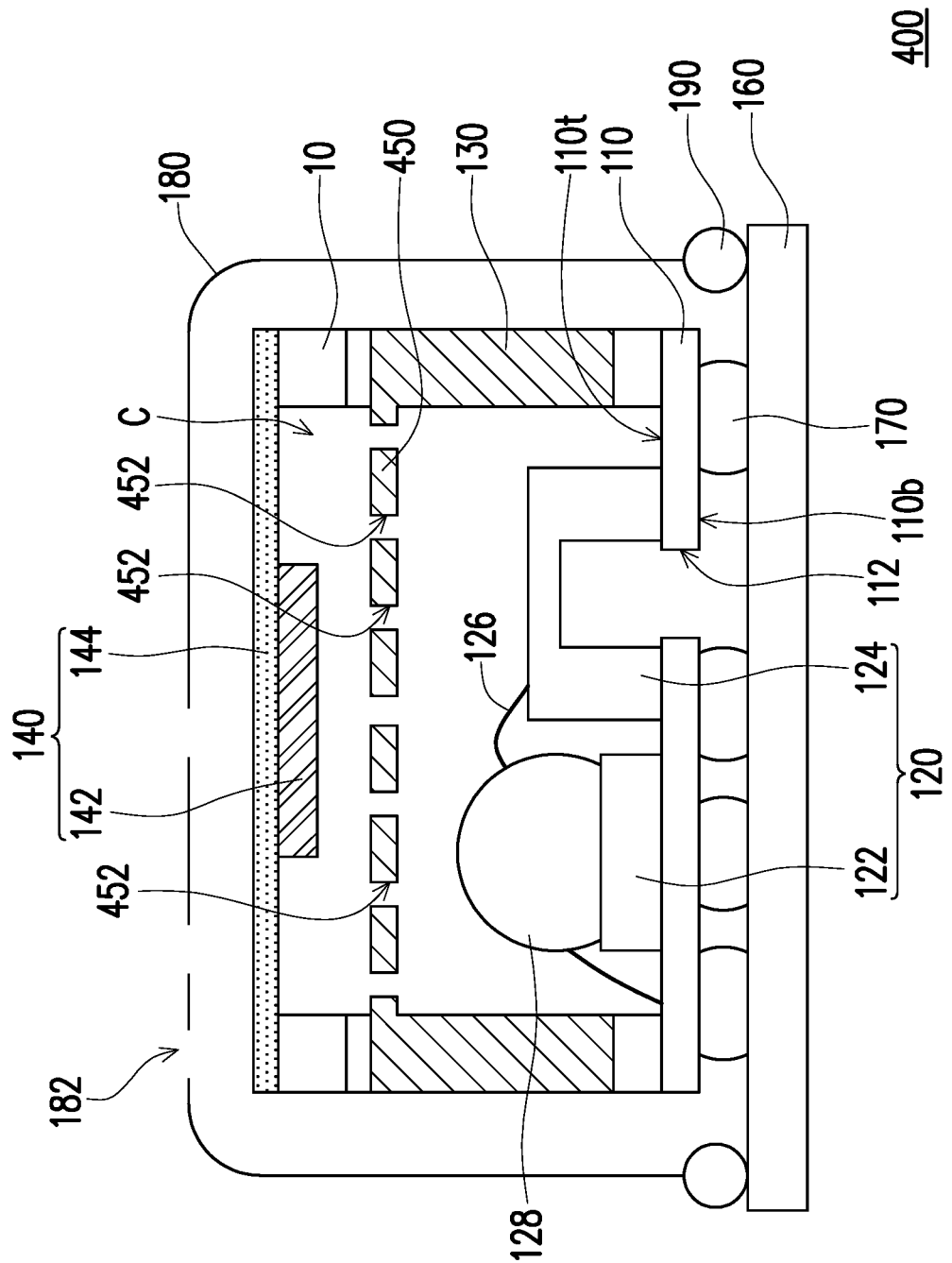
FIG. 4 is a schematic cross-sectional view of an electronic device according to another embodiment of the disclosure.
Figure 5:
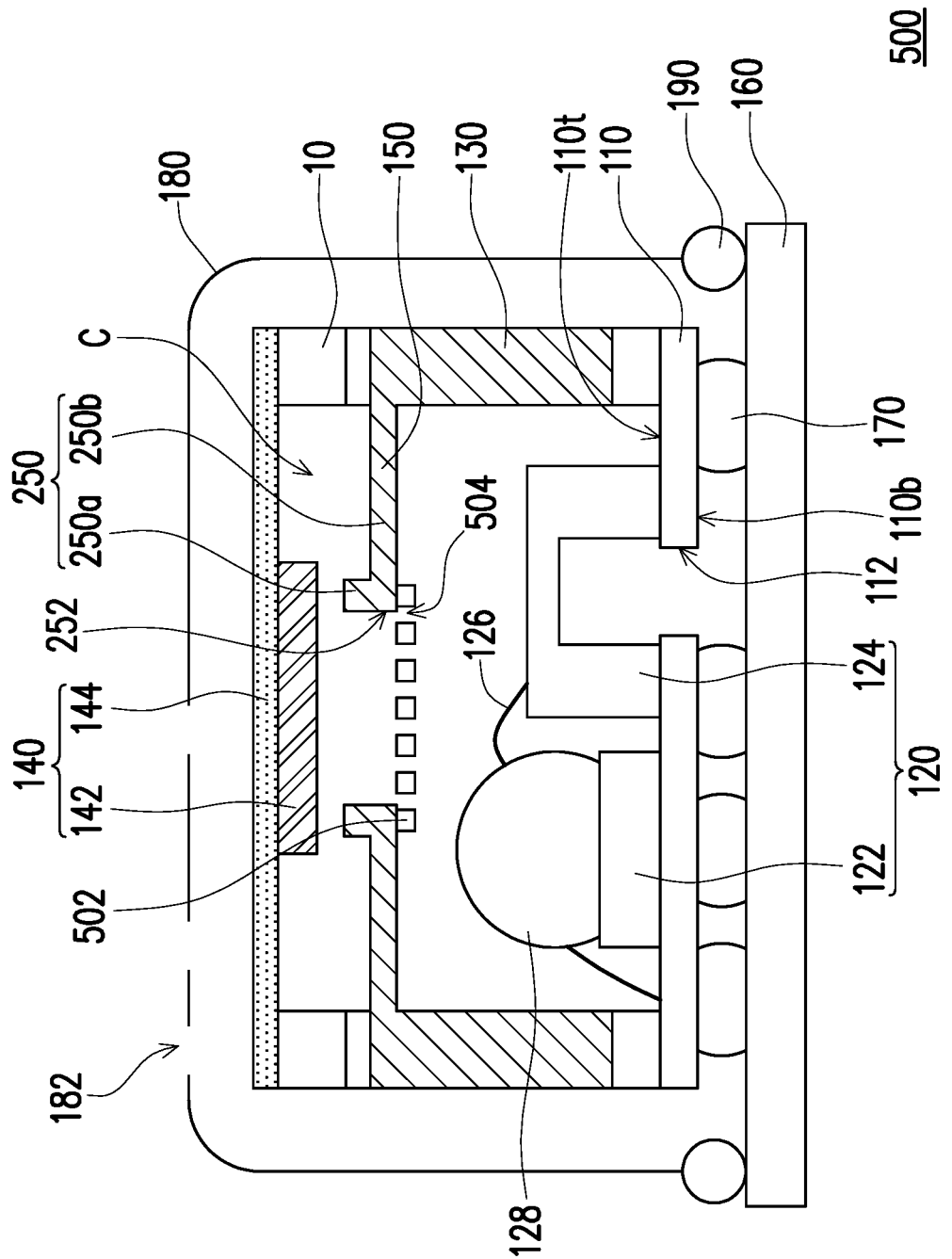
FIG. 5 is a schematic cross-sectional view of an electronic device according to another embodiment of the disclosure.

FIG. 4 is a schematic cross-sectional view of an electronic device according to another embodiment of the disclosure. Referring to FIG. 4, compared with the electronic device 100, a stopping structure 450 of an electronic device 400 of this embodiment may have a plurality of openings 452. Through the design of a plurality of openings, air damping in the cavity C may be adjusted more flexibly. Therefore, the response may be made flatter, and the electronic device 400 may have better sensitivity, but the disclosure is not limited thereto. It should be noted that the number of openings may be determined according to actual design requirements, and the disclosure is not limited thereto.

FIG. 5 is a schematic cross-sectional view of an electronic device according to another embodiment of the disclosure. Referring to FIG. 5, compared to the electronic device 200, an electronic device 500 of this embodiment may further include a tuning layer 502. The tuning layer 502 is disposed on a surface of the stopping structure 250 close to the sensor 120. In this way, air damping in the cavity C may be adjusted more flexibly to further improve the frequency response of the electronic device 500, but the disclosure is not limited thereto. Here, the tuning layer 502 may be a high temperature resistant air-permeable membrane or other suitable materials, and the tuning layer 502 may be disposed on the stopping structure 250 by attaching.

In addition, the tuning layer 502 may be disposed corresponding to the opening 252 of the stopping structure 250. For example, the tuning layer 502 may extend from one side of the opening 252 to another side of the opening 252, but the disclosure is not limited thereto.

In some embodiments, the tuning layer 502 has a plurality of openings 504. Therefore, through the combination of the opening 252 and the opening 504, the air pressure in the cavity C may further be adjusted, so that the frequency response of the electronic device 500 is further adjusted. However, the disclosure is not limited thereto.

Figure 6:
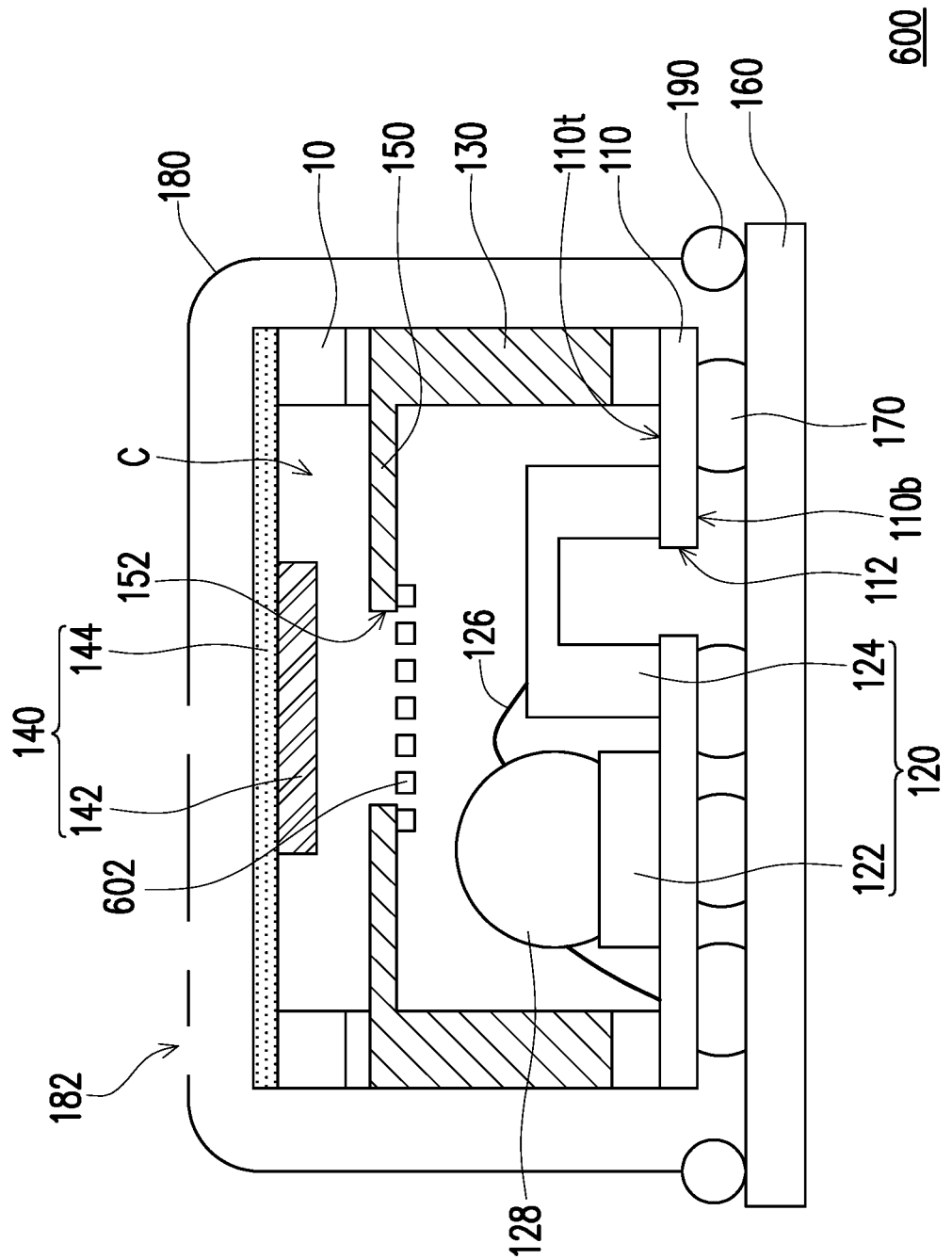
FIG. 6 is a schematic cross-sectional view of an electronic device according to another embodiment of the disclosure.

FIG. 6 is a schematic cross-sectional view of an electronic device according to another embodiment of the disclosure. Referring to FIG. 6, compared to the electronic device 100, an electronic device 600 of this embodiment may further include a tuning layer 602. The tuning layer 602 is disposed on a surface of the stopping structure 150 close to the sensor 120. Here, the material and function of the tuning layer 602 may be similar to that of the tuning layer 502, and details thereof will not be repeated herein.

Figure 7:
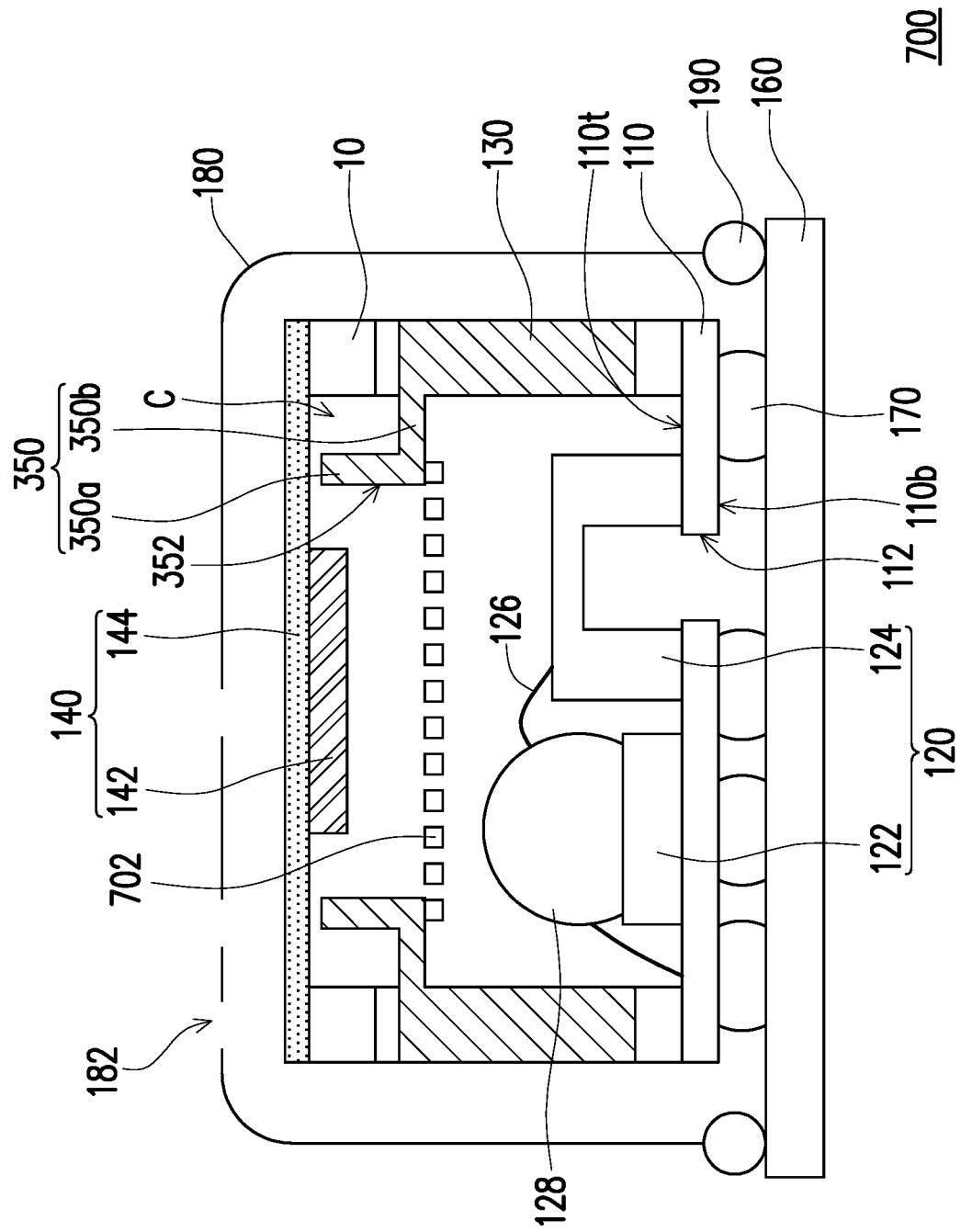
FIG. 7 is a schematic cross-sectional view of an electronic device according to another embodiment of the disclosure.

FIG. 7 is a schematic cross-sectional view of an electronic device according to another embodiment of the disclosure. Referring to FIG. 7, compared with the electronic device 300, an electronic device 700 of this embodiment may further include a tuning layer 702. The tuning layer 702 is disposed on a surface of the stopping structure 350 close to the sensor 120. In addition, in this embodiment, the tuning layer 702 has a longer extending length compared with the tuning layer 502 in FIG. 5, but the disclosure is not limited thereto. Here, the material and function of the tuning layer 702 may be similar to that of the tuning layer 502, and details thereof will not be repeated herein.

Figure 8:
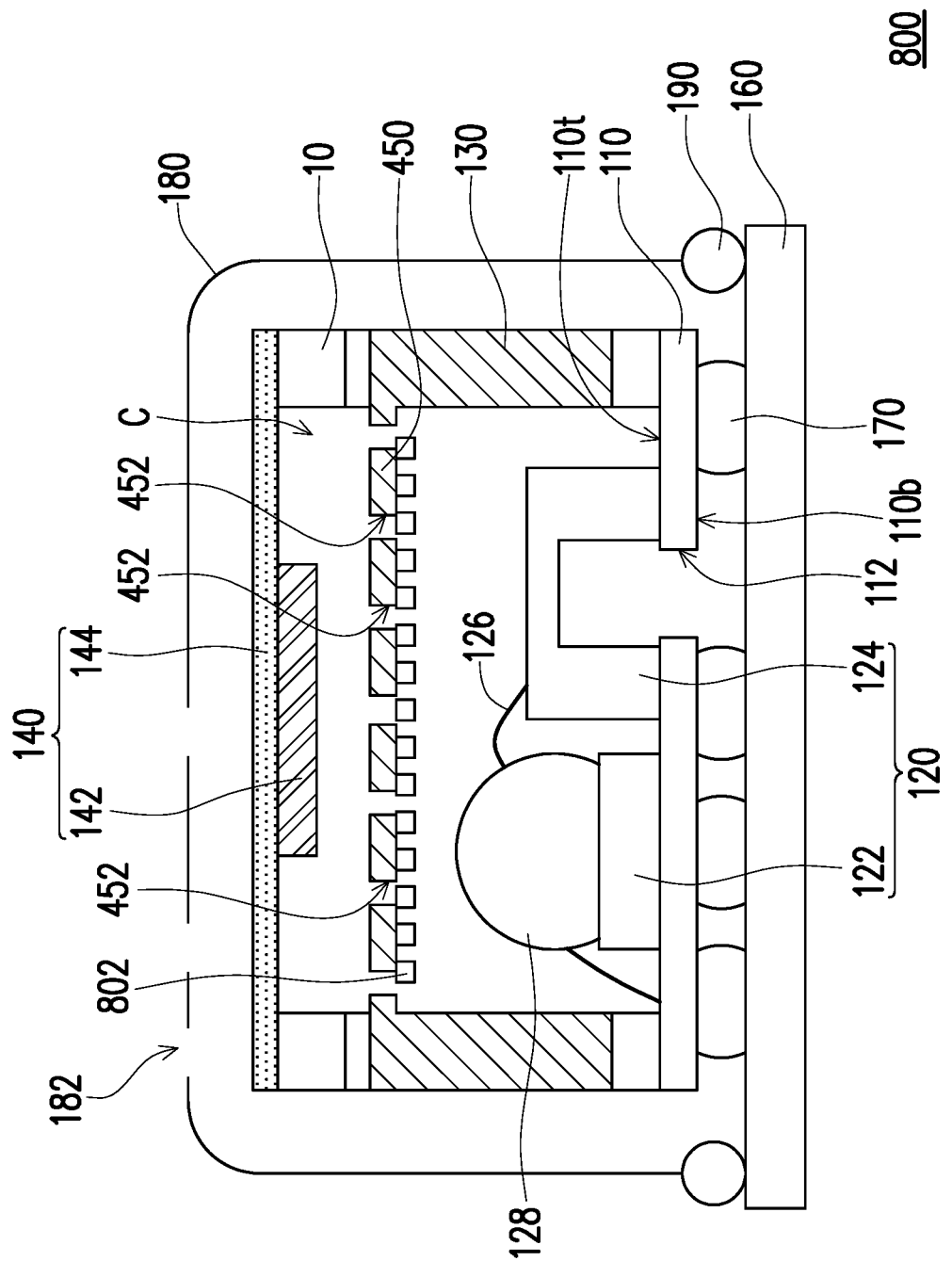
FIG. 8 is a schematic cross-sectional view of an electronic device according to another embodiment of the disclosure.

FIG. 8 is a schematic cross-sectional view of an electronic device according to another embodiment of the disclosure. Referring to FIG. 8, compared with the electronic device 400, an electronic device 800 of this embodiment may further include a tuning layer 802. The tuning layer 802 is disposed on a surface of the stopping structure 450 close to the sensor 120. Here, the material and function of the tuning layer 802 may be similar to that of the tuning layer 502, and details thereof will not be repeated herein.

In this embodiment, the tuning layer 802 may correspond to all the openings 452. For example, the tuning layer 802 may correspond to the openings 452 at a central area and a peripheral area of the stopping structure 450, but the disclosure is not limited thereto. The position of disposing the tuning layer 802 may be determined according to actual design requirements. For example, the tuning layer 802 may only correspond to the opening 452 at the central area (not shown).

It should be noted that the disclosure is not limited to the aspect of the above-mentioned embodiments. The above-mentioned embodiments may be combined and adjusted according to actual design requirements. As long as a design has a corresponding stopping structure, the design shall be considered to be within the scope of the disclosure.

To sum up, in the electronic device of the disclosure, through adopting the stopping structure, the stopping structure is disposed between the pressurizing component and the partition wall structure and extends into the cavity having the sensor. In this way, the stopping structure limits the over-displacement of the pressurizing component. In addition, since the stopping structure has at least one opening penetrating the stopping structure, the existence of the stopping structure does not affect the transmission of air pressure from the electronic device to the sensor. Therefore, in the electronic device of the disclosure, the vibration performance of the sensor is improved, and the situation of the sensor being damaged and the electronic device failing to operate due to the pressurizing component, when being subject to strong external impact, excessively vibrating and hitting the sensor, is avoided. In addition, through the design of the opening and tuning layer, air damping in the cavity is flexibly adjusted to further improve the frequency response of the electronic device.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the protection scope of the disclosure is subject to the scope of the appended claims.

What is claimed is:

1. An electronic device, comprising:
   a substrate, having a carrying surface;
   a sensor, disposed on the carrying surface;
   a partition wall structure, disposed on the carrying surface, surrounding the sensor;
   a pressurizing component, disposed on the partition wall structure, wherein the pressurizing component, the partition wall structure, and the substrate jointly form a cavity, the pressurizing component comprises a mass and a vibration membrane, and an outer edge of the vibration membrane is disposed at a location corresponding to the partition wall structure; and
   a stopping structure, disposed between the pressurizing component and the partition wall structure, extending into the cavity, wherein the stopping structure has at least one opening penetrating the stopping structure.

2. The electronic device according to claim 1, wherein the stopping structure is disposed between the pressing component and the sensor, and forms at least one spacing with the pressurizing component and the sensor, respectively.

3. The electronic device according to claim 2, wherein a shortest distance between the stopping structure and the pressurizing component is less than a shortest distance between the stopping structure and the sensor.

4. The electronic device according to claim 1, wherein a shape of the mass and a shape of the at least one opening are both rectangular.

5. The electronic device according to claim 4, wherein a length of the at least one opening is greater than a length of the mass.

6. The electronic device according to claim 1, wherein a material of the partition wall structure is different from a material of the stopping structure, and the stopping structure is sandwiched between the partition wall structure and the pressurizing component.

7. The electronic device according to claim 1, wherein a material of the partition wall structure is the same as a material of the stopping structure, and the partition wall structure and the stopping structure are an integral structure.

8. The electronic device according to claim 1, wherein the at least one opening is aligned to the mass.

9. The electronic device according to claim 1, wherein the mass, the at least one opening, and the sensor at least partially overlap.

10. The electronic device according to claim 1, wherein a width of the at least one opening is smaller than a width of the mass.

11. The electronic device according to claim 1, wherein the stopping structure comprises an anti-stiction protrusion extending toward the vibration membrane and a support portion connected to the anti-stiction protrusion.

12. The electronic device according to claim 11, wherein the anti-stiction protrusion is aligned to the vibration membrane.

13. The electronic device according to claim 11, wherein the anti-stiction protrusion surrounds a periphery of the support portion and is disposed along a periphery of the at least one opening.

14. The electronic device according to claim 1, wherein the at least one opening is a plurality of openings.

15. The electronic device according to claim 1, further comprising a tuning layer, disposed on a surface of the stopping structure close to the sensor.

16. The electronic device according to claim 15, wherein the tuning layer is disposed corresponding to the at least one opening.

17. The electronic device according to claim 1, wherein the outer edge of the vibration membrane is aligned with an outer edge of the partition wall structure.

18. An electronic device, comprising:

a substrate, having a carrying surface;

a sensor, disposed on the carrying surface;

a partition wall structure, disposed on the carrying surface, surrounding the sensor;

a pressurizing component, disposed on the partition wall structure, wherein the pressurizing component, the partition wall structure, and the substrate jointly form a cavity, the pressurizing component comprises a mass and a vibration membrane; and a stopping structure, disposed between the pressurizing component and the partition wall structure, extending into the cavity, wherein the stopping structure has at least one opening penetrating the stopping structure and an orthographic projection area of the stopping structure on the substrate is totally inside an orthographic projection area of the vibration membrane on the substrate.

* * * * *